(12) United States Patent
Tseng et al.

(10) Patent No.: US 6,294,415 B1
(45) Date of Patent: Sep. 25, 2001

(54) METHOD OF FABRICATING A MOS TRANSISTOR

(75) Inventors: Hua-Chou Tseng; Chien-Ting Lin, both of Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/558,220

(22) Filed: Apr. 26, 2000

(51) Int. Cl.[7] .................. H01L 21/336; H01L 21/8234
(52) U.S. Cl. .................. 438/197; 438/199; 438/486; 438/230; 438/305; 438/564
(58) Field of Search .................. 438/197, 199, 438/486, 487, 483, 508, 530, 542, 557, 230, 286, 305, 564

(56) References Cited

U.S. PATENT DOCUMENTS

| | | | |
|---|---|---|---|
| 5,908,307 | * 6/1999 | Talwar et al. | 438/197 |
| 6,096,628 | * 8/2000 | Greenlaw et al. | 438/530 |
| 6,136,636 | * 10/2000 | Wu | 438/231 |
| 6,146,934 | * 11/2000 | Gardner et al. | 438/230 |

\* cited by examiner

*Primary Examiner*—Matthew Smith
*Assistant Examiner*—Igwe U. Anya
(74) *Attorney, Agent, or Firm*—Winston Hsu

(57) ABSTRACT

An improved method of fabricating a MOS transistor on a semiconductor wafer is disclosed. A pre-amorphization implant (PAI) process is used to dope the silicon substrate adjacent to the gate. The dopants formed in the silicon substrate during the first ion implantation process are driven into the substrate to form the HDD via a salicide process. A conventional annealing process is skipped in the present invention, which significantly reduces the thermal budget of the manufacturing process.

20 Claims, 4 Drawing Sheets

METHOD OF FABRICATING A MOS TRANSISTOR

BACKGROUND OF THE INVENTION

1. Field of the Invention

The present invention relates a method of fabricating a MOS transistor on a semiconductor wafer, and more particularly, to an economic method of fabricating a MOS transistor on a semiconductor wafer.

2. Description of the Prior Art

Metal oxide semiconductor (MOS) transistors are in wide use in many electric devices. A MOS transistor has four terminals: the source, the drain, the gate and the substrate. The gate structure usually includes a polycrystalline silicon layer, or a polysilicon layer, and a silicide layer such as cobalt silicide ($CoSi_2$). When a gate voltage greater than the threshold voltage of a MOS transistor is applied to the gate, a channel forms between the source and the drain due to strong inversion.

During the manufacturing process of a MOS transistor, the semiconductor wafer usually experiences several heating, or thermal, processes that are performed at high temperatures, such as 1000 to 1100° C. Unfortunately, this leads to an increasing thermal budget and, as the line width shrinks down to 0.18, 0.15 micrometers or lower, influences the precision when controlling the doping concentration of the heavily doped drain (HDD) region.

Please refer to FIG. 1 to FIG. 4. FIG. 1 to FIG. 4 are cross-sectional diagrams of fabricating a MOS transistor on a semiconductor wafer 10 according to the prior art. As shown in FIG. 1, a gate 20 is first formed on the semiconductor wafer 10. The semiconductor wafer 10 comprises a plurality of shallow trenches 18. The gate 20 comprises a gate oxide layer 22 formed on the surface of a silicon substrate 12, and a doped polysilicon layer 24 formed on the gate oxide layer 22. A liner oxide layer 26 composed of silicon oxide is deposited to cover the surface of the silicon substrate 12 and the gate 20. A silicon nitride layer (not shown) is then formed on the liner oxide layer 26 and an etching back process is performed to etch the silicon nitride layer and the liner oxide layer 26 down to the surface of the silicon substrate 12. The remaining silicon nitride layer adjacent to the gate 20 forms spacers 28.

Subsequently, a first ion implantation process is performed using the gate 20 and the spacers 28 as hard masks to form a doped area (not shown). An annealing process is performed at a temperature of between 1000 to 1100° C. (1832 to 2012° F.) to form a source 14 and a drain 16.

As shown in FIG. 2, the spacers 28 and the liner oxide layer 26 are removed and a second ion implantation using the gate 20 as hard masks is performed to dope the silicon substrate 12 adjacent to the gate 20. An annealing process at a temperature of between 800 to 1000° C. (1472 to 1832° F.) is used to form a heavily doped drain (HDD) region 30.

As shown in FIG. 3, A silicon oxide layer 34 composed of silicon dioxide is deposited on the semiconductor wafer 10 and a low pressure chemical vapor deposition (LPCVD) at a temperature of between 750 to 800° C. (1382 to 1472° F.) is performed to deposit a silicon nitride layer (not shown) on the semiconductor wafer 10. A reactive ion etching process is used to form a spacer 36 adjacent to the gate 20 and portions of the silicon oxide layer 34 formed on the source 14 the drain 16 and the gate 20 are removed. A self-aligned silicide (salicide) process is performed to deposit a cobalt metal layer 38 on the surface of the silicon substrate 12 and the surface of the gate 20. A rapid thermal process (RTP) is then performed at a temperature of between 700 to 850° C. (1292 to 1562° F.) to form the salicide 32. The non-reacting portions of the cobalt metal layer 38 are removed.

The drawback in the prior art method is that the semiconductor wafer experiences several high-temperature thermal processes. For example, the annealing process is performed at a temperature of between 800 to 1000° C. (1472 to 1832° F.) to form the HDD region 30, the LPCVD process is used at a temperature of between 750 to 850° C. (1382 to 1562° F.) to deposit a silicon nitride layer and the rapid thermal process is performed at a temperature of between 700 to 850° C. (1292 to 1562° F.) to form the salicide. These high-temperature processes may result in undesirable diffusion of the dopants in the HDD region 30 and the expansion of the area of the HDD region 30, decreasing the channel length and thus inducing short channel effects. This becomes much worse when using B or $BF_2^+$ as a dopant because the atomic mass of the B or $BF_2^+$ is smaller than P.

SUMMARY OF THE INVENTION

It is therefore a primary objective of the present invention to provide an economic method of fabricating a MOS transistor on a semiconductor wafer that prevents HDD dopant diffusion and reduces the thermal budget.

According to the present invention, a gate is formed on the surface of the silicon substrate. A first silicon oxide layer is formed on the surface of the semiconductor wafer to cover the surface of the silicon substrate and the surface of the gate. A first spacer is then formed on the surface of the first silicon oxide layer adjacent to the gate. A source and a drain are formed in the silicon substrate adjacent to the first spacer. The first spacer and the first silicon oxide layer are removed. A pre-amorphization implant (PAI) process is performed with germanium (Ge) as a dopant. A first ion implantation process is used to dope the silicon substrate adjacent to the gate. A second silicon oxide layer is formed to cover the gate. A PECVD process is performed to form a second spacer on the surface of the second silicon oxide layer adjacent to the gate. Finally, the second silicon oxide layer over the source, drain and gate is removed and a self-alignment silicide (salicide) process is performed to form a silicide layer on the surface of the source, drain and gate.

It is an advantage that the present invention uses the PAI process to dope the silicon substrate adjacent to the gate and then drives the dopants formed in the silicon substrate during the first ion implantation process into the silicon substrate to form the HDD region by virtue of the salicide process.

DETAILED DESCRIPTION OF THE PREFERRED EMBODIMENT

Figure 1:
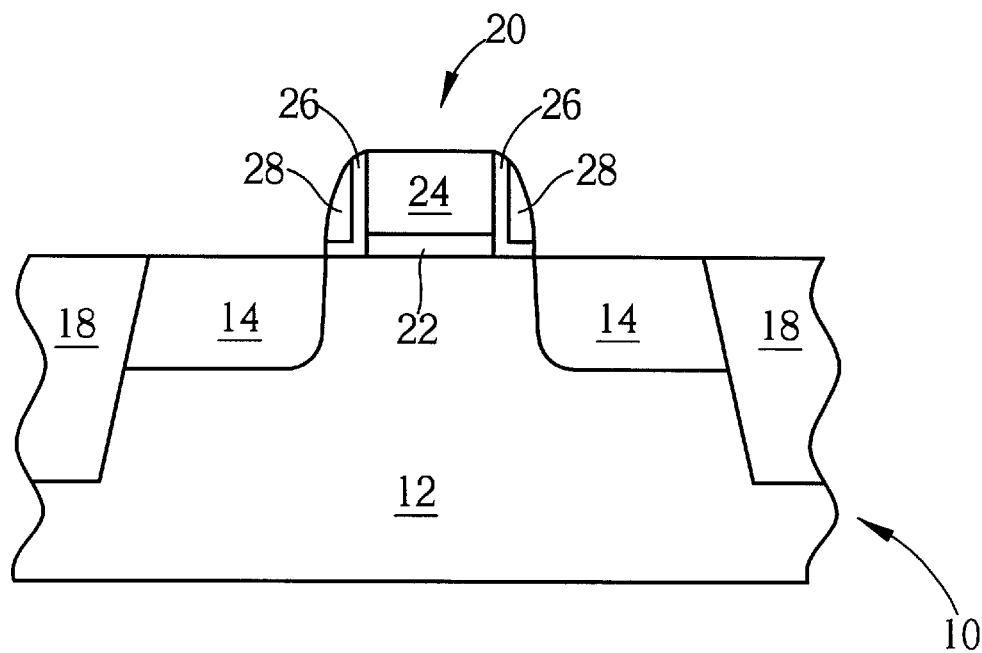
FIG. 1 to FIG. 4 are cross-sectional diagrams of fabricating a MOS transistor on a semiconductor wafer according to the prior art.
Figure 2:
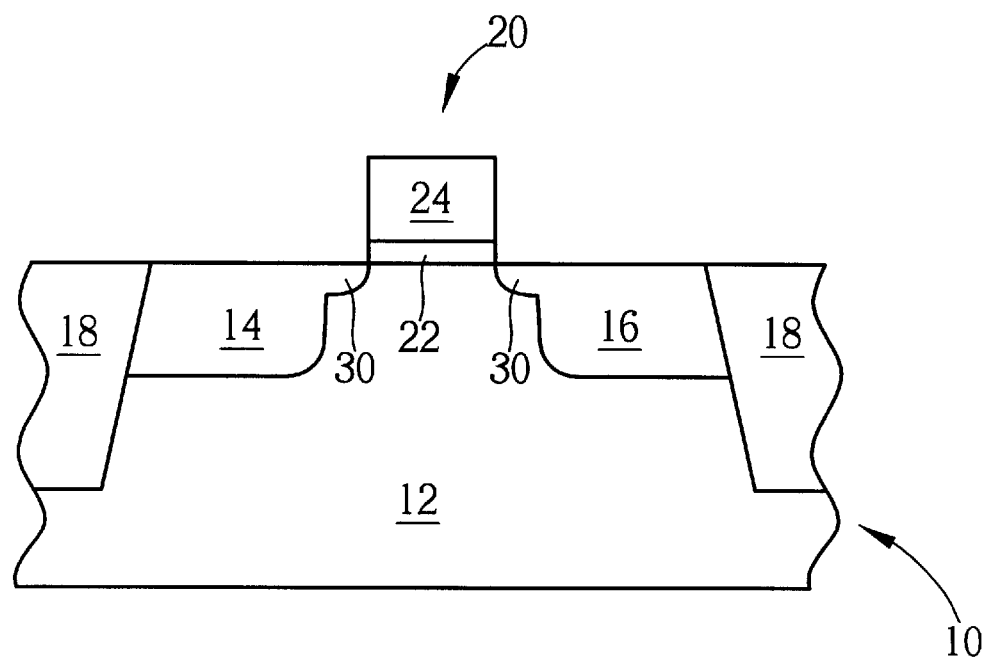
Figure 3:
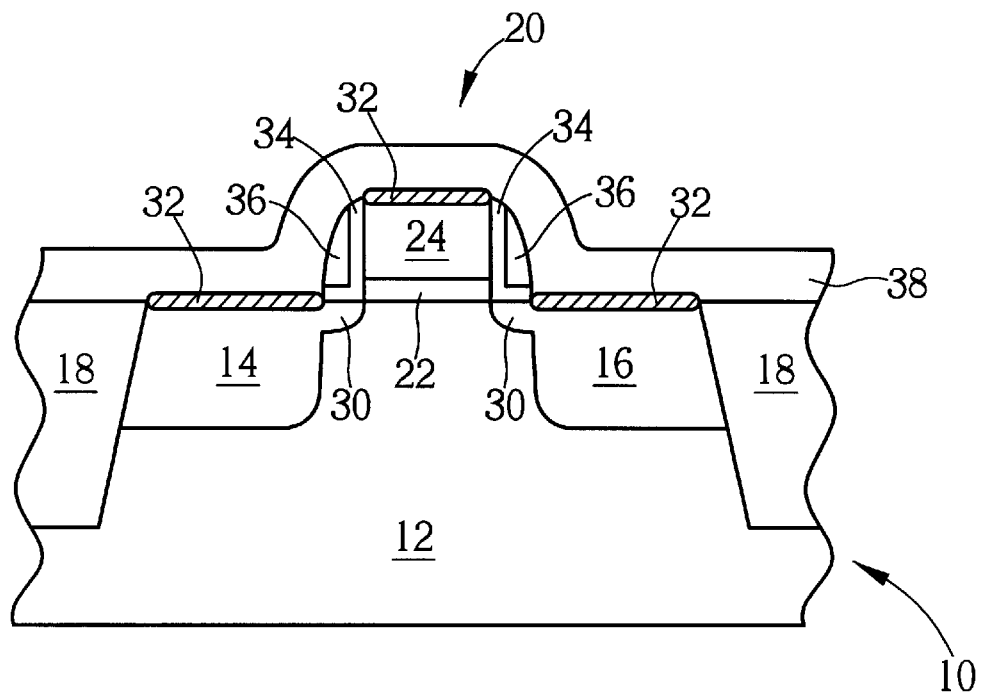
Figure 4:
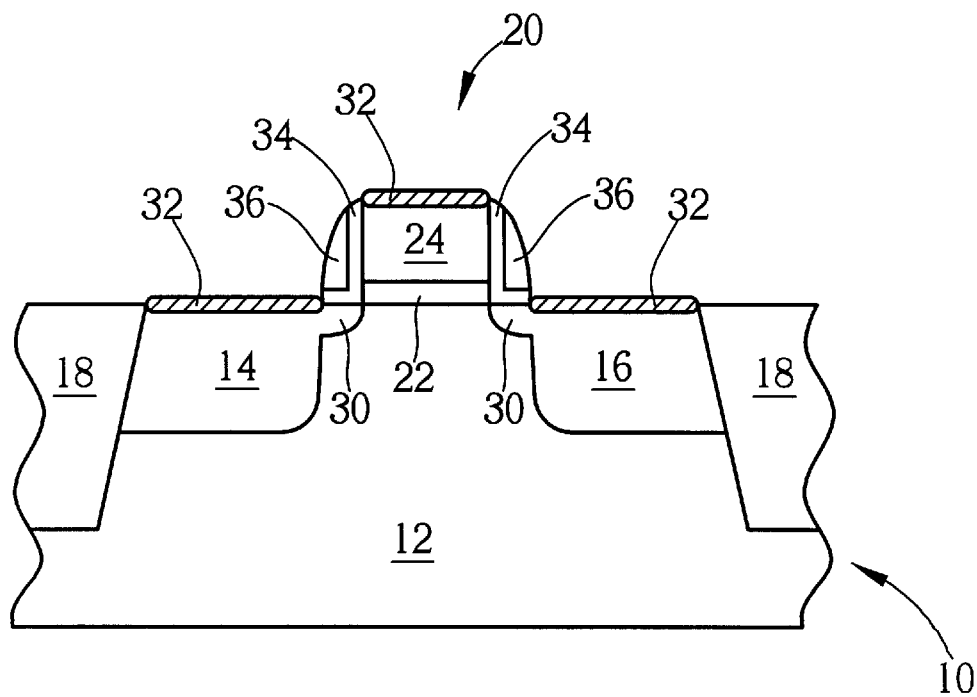
Figure 5:
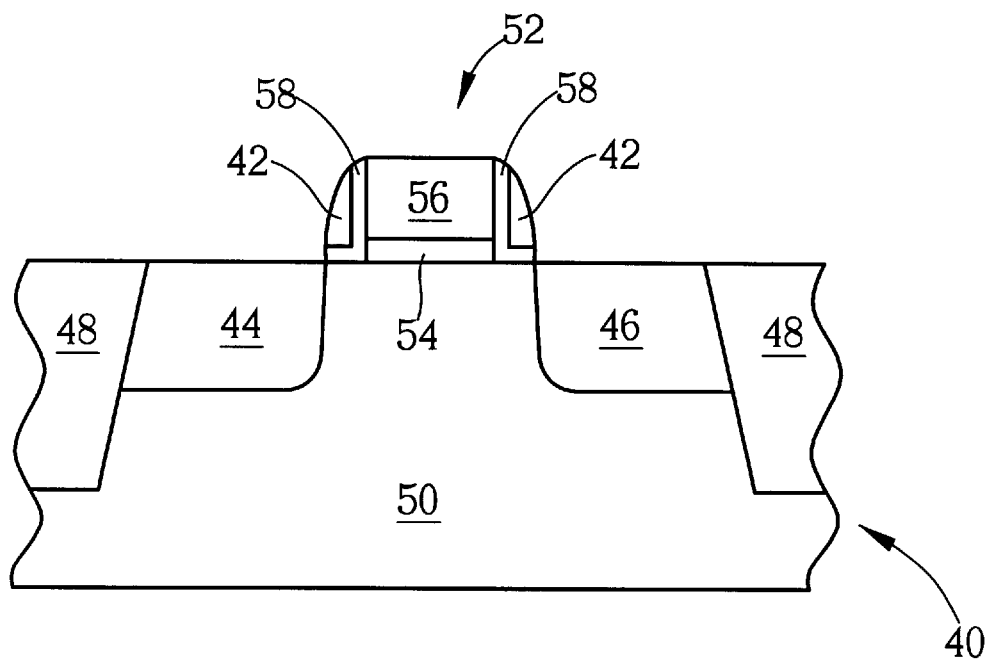
FIG. 5 to FIG. 8 are cross-sectional diagrams of fabricating a MOS transistor on a semiconductor wafer according to the present invention.

Please refer to FIG. 5 to FIG. 8. FIG. 5 to FIG. 8 are cross-sectional diagrams of fabricating a MOS transistor on a semiconductor wafer 40 according to the present invention. As shown in FIG. 5, the semiconductor wafer 40 comprises a silicon substrate 50 and a plurality of shallow trenches 48 formed in the silicon substrate 50. A gate 52 is formed on the semiconductor wafer 40. The gate 52 comprises a gate oxide layer 54 formed on the surface of the silicon substrate 50 and a doped polysilicon layer 56 formed on the gate oxide layer 54. A first silicon oxide layer 58 composed of $SiO_2$ with a thickness of about 200 Å ($9.0 \times 10^{-7}$ inches) is then deposited on the semiconductor wafer 40 to cover the surface of the silicon substrate 50 and the gate 52. The first silicon oxide layer 58 acts as a stop layer in the subsequent etching back process, and is mainly used to prevent channel effects.

An LPCVD process is then performed at a temperature of between 750 to 800° C. (1382 to 1472° F.) to deposit a silicon nitride layer (not shown) on the surface of the first silicon oxide layer 58. An etching back process is performed to etch the silicon nitride layer and the first silicon oxide layer 58 down to the surface of the silicon substrate 50. The remaining portions of the silicon nitride layer covering the surface of the remaining portions of the first silicon oxide layer 58 therefore form a first spacer 42 adjacent to the gate 52.

A conventional ion implantation process is then performed to form a source 44 and a drain 46 in the silicon substrate 50 adjacent to the first spacer 42. During the ion implantation process, the gate 52 and the first spacer 42 are used as hard masks. After the ion implantation process, an annealing process is performed at a temperature of between 1000 to 1100° C. (1832 to 2012° F.) to restore the crystal structure of the silicon substrate 50 and drive the dopants into the silicon substrate 50.

Figure 6:
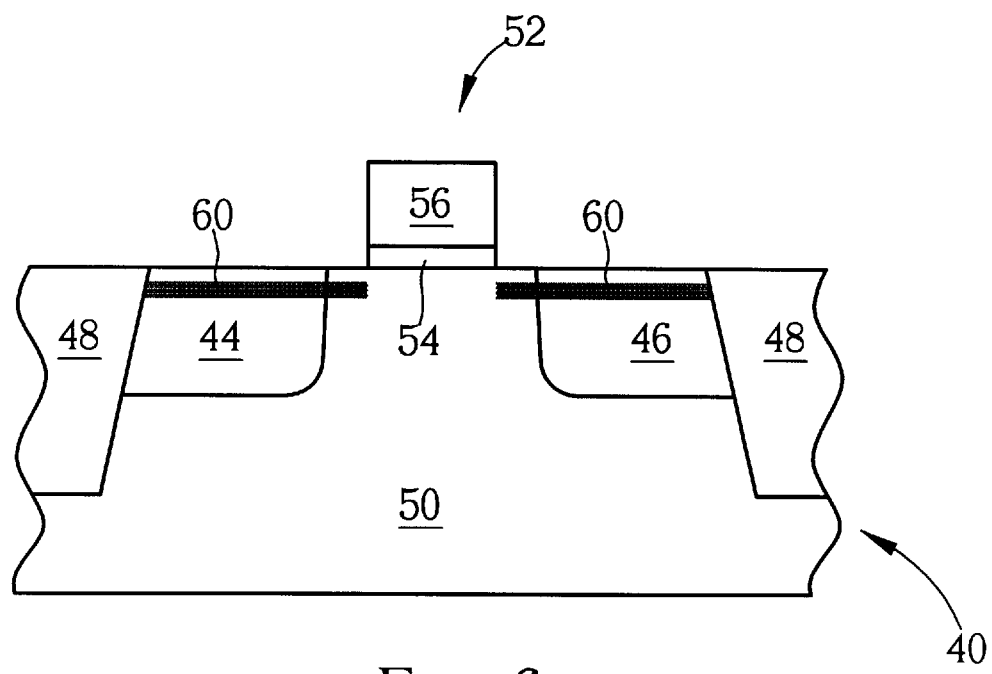

As shown in FIG. 6, the first spacer 42 and the first silicon oxide layer 58 are removed using a conventional wet etching method. Subsequently, a PAI process using germanium (Ge) as a dopant is performed. The doping dosage of Ge used in the PAI process is between $3*10^{14}$ to $2*10^{15}$ atoms/cm$^2$ and the doping energy is between 20 to 60 KeV. The PAI process is used to change the silicon lattice of the silicon substrate 50 from a crystalline state to an amorphous state. Dopants in the doped area 60 converge at a depth of about 300 to 800 angstroms near the surface of the silicon substrate 50 due to the change of the crystalline state of the silicon substrate 50. In addition, the dopants in the doped area 60 are not easily thermally diffused after performing the PAI process.

Figure 7:
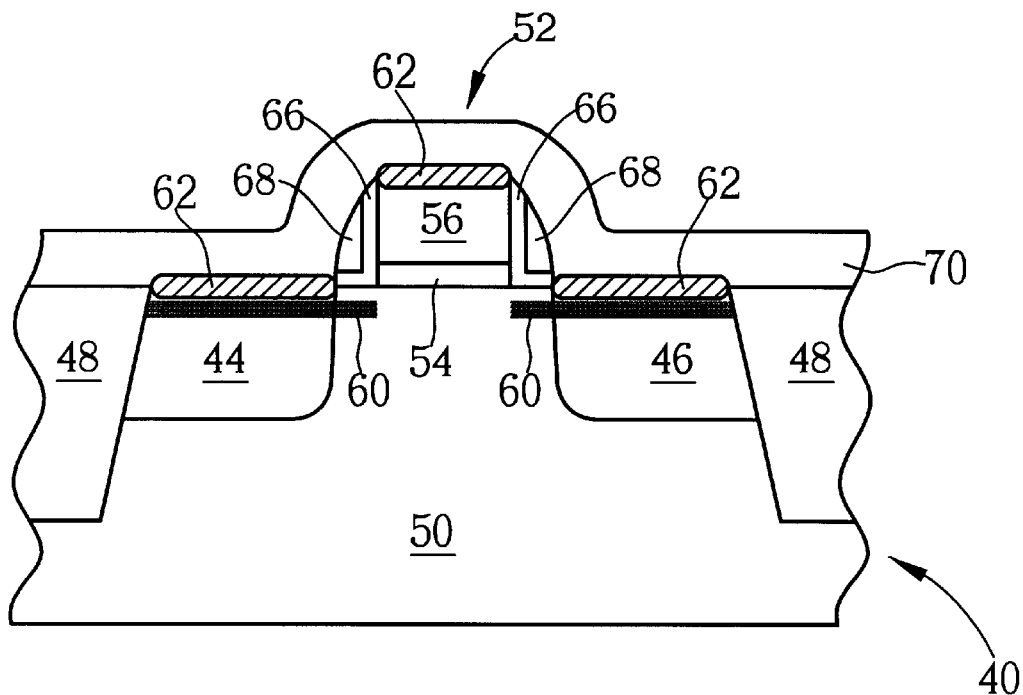
Figure 8:
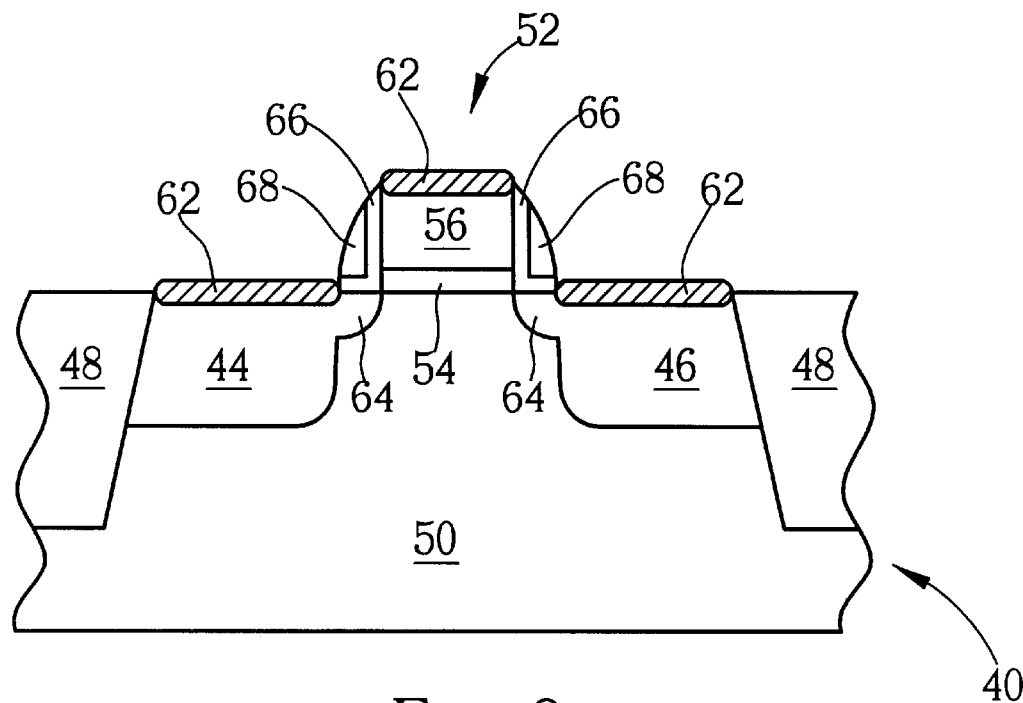

As shown in FIG. 7, a second silicon oxide layer 66 with a thickness of about 50 to 200 angstroms is formed on the surface of the semiconductor wafer 40 to cover the surface of the silicon substrate 50 and the surface of the gate 52. A PECVD process is performed at a temperature of between 250 to 600° C. (482 to 1112° F.) to deposit a silicon nitride layer (not shown) on the surface of the semiconductor wafer 40. A highly selective and anisotropic reactive ion etching process is performed to etch the silicon nitride layer and the second silicon oxide layer 66 so as to form a second spacer 68 adjacent to the gate 52. Portions of the second silicon oxide layer 66 formed on the source 44, drain 46 and gate 52 are then removed.

A self-aligned silicide (salicide) process is performed to form a metal layer 70 on the surface of the semiconductor wafer 40 covering the surface of the source 44, the drain 46 and the gate 52. The metal layer 70 could be composed of Cobalt, titanium, nickel, or molybdenum. By virtue of the salicide process, the dopants implanted during the first ion implantation process are driven into the silicon substrate 50 to form a heavily doped drain (HDD) region 64 of the MOS transistor. Thereafter, a first rapid thermal process (RTP) is used at a temperature of between 400 to 600° C. (752° F. to 1112° F.) for a heating time of between 10 to 50 seconds. Silicide 62 such as $Co_2Si$ or $CoSi$ forms on the surface of the source 44 drain 46 and gate 52 during the first RTP. The non-reacting metal of the metal layer 70 is removed from the surface of the semiconductor wafer 40 using a wet etching process. Finally, the semiconductor wafer 40 is subject to a second RTP at a temperature of between 600 to 800° C. (1112 to 1472° F.) for a heating time of between 10 to 50 seconds.

According to the present invention, the second RTP is used to transform $Co_2Si$ and $CoSi$ that is formed during the first RTP to $CoSi_2$, and thus enhance the conductivity of the silicide 62 and improve electric performance of the MOS transistor. In addition, the first and second RTP cause diffusion of the dopants in the doped area 60 so as to form the HDD region 64.

In contrast to the prior art method, the present invention method is a more economic way to manufacture a MOS transistor, because it skips the conventional annealing process and results in a significant reduction of the thermal budget. Instead of the conventional annealing process, the present invention uses the first and second RTP to drive the dopants formed in the doped area 60 into the silicon substrate 50 so as to form the HDD region 64. Furthermore, the present invention can effectively prevent out diffusion problems of the dopants in the HDD region 64 because the temperature during the first RTP, the second RTP and the PECVD process is much lower than the conventional annealing process and the LPCVD process used in the prior art method.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a MOS transistor on a semiconductor wafer, the semiconductor wafer comprising a silicon substrate, the method comprising:

forming a gate on the surface of the silicon substrate;

forming a first silicon oxide layer on the surface of the semiconductor wafer, the first silicon oxide layer covering the surface of the silicon substrate and the surface of the gate;

forming a first spacer on the surface of the first silicon oxide layer adjacent to the gate;

forming a source and a drain in the silicon substrate adjacent to the first spacer;

removing the first spacer and the first silicon oxide layer;

performing a pre-amorphization implant (PAI);

performing a first ion implantation process to dope the silicon substrate adjacent to the gate;

forming a second silicon oxide layer on the surface of the semiconductor wafer, the second silicon oxide layer covering the surface of the silicon substrate and the surface of the gate;

forming a second spacer on the surface of the second silicon oxide layer adjacent to the gate;

removing the second silicon oxide layer over the source, the drain, and the gate; and forming a silicide layer on the surface of the source, the drain, and the gate.

2. The method of claim 1 wherein the gate comprises a gate oxide layer formed on the surface of the silicon substrate, and a doped polysilicon layer formed on the gate oxide layer.

3. The method of claim 1 wherein the first spacer is fabricated using a low pressure chemical vapor deposition (LPCVD) process to deposit a silicon nitride layer, the LPCVD process being performed at a temperature of 650~800° C.

4. The method of claim 1 wherein the fabrication of the source and the drain further comprises:
   performing a second ion implantation process using the first spacer and the gate as hard masks to dope the silicon substrate adjacent to the first spacer; and
   performing an annealing process at a temperature of 1000~1100° C. to drive the dopants of the second ion implantation process into the substrate to form the source and the drain.

5. The method of claim 1 wherein germanium (Ge) is the dopant used for the pre-amorphization implant (PAI).

6. The method of claim 1 wherein the second spacer is formed using a plasma-enhanced chemical vapor deposition (PECVD) process at a temperature of 250~600° C. to deposit silicon nitride onto the surface of the semiconductor wafer.

7. The method of claim 1 wherein the silicide layer is formed using a self-aligned silicide (salicide) process, the self-aligned silicide process comprising:
   forming a metal layer on the surface of the semiconductor wafer, the metal layer covering the surface of the source, the drain, and the gate;
   performing a first rapid thermal process (RTP);
   performing a wet etching process to remove unreacted metal of the metal layer from the surface of the semiconductor wafer; and
   performing a second rapid thermal process (RTP).

8. The method of claim 7 wherein the metal layer is composed of cobalt (Co), titanium (Ti), nickel (Ni), or molybdenum (Mo).

9. The method of claim 7 wherein the first rapid thermal process (RTP) is performed at a temperature of 400~600° C. for a period of 10~50 seconds, and the second rapid thermal process is performed at a temperature of 600~800° C. for a period of 10~50 seconds.

10. The method of claim 7 wherein the self-aligned silicide process drives the dopants of the first ion implantation process into the substrate to form a heavily doped drain (HDD) of the MOS transistor.

11. A method of fabricating a MOS transistor on a semiconductor wafer, the semiconductor wafer comprising a silicon substrate, the method comprising:
   defining an active area on the surface of the silicon substrate;
   forming a gate in a pre-determined area on the surface of the active area;
   forming a first silicon oxide layer on the surface of the active area;
   forming a first spacer on the surface of the first silicon oxide layer adjacent to the gate;
   forming a source and a drain in the silicon substrate of the active area adjacent to the first spacer;
   removing the first spacer and the first silicon oxide layer;
   performing a pre-amorphization implant (PAI) on the surface of the silicon substrate of the active area;
   performing a first ion implantation process to dope the surface of the silicon substrate of the active area;
   forming a second silicon oxide layer on the surface of the wafer;
   forming a second spacer on the surface of the second silicon oxide layer adjacent to the gate;
   removing the second silicon oxide layer from the surface of the source, the drain, and the gate; and
   forming a silicide layer on the surface of the source, the drain, and the gate.

12. The method of claim 11 wherein the gate comprises a gate oxide layer formed on the surface of the silicon substrate, and a doped polysilicon layer formed on the gate oxide layer.

13. The method of claim 11 wherein the first spacer is fabricated using a low pressure chemical vapor deposition (LPCVD) process at a temperature of 650~800° C. to deposit silicon nitride on the surface of the semiconductor wafer.

14. The method of claim 11 wherein the fabrication of the source and the drain further comprises:
   performing a second ion implantation process using the first spacer and the gate as hard masks to dope the silicon substrate adjacent to the first spacer; and
   performing an annealing process at a temperature of 1000~1100° C. to drive the dopants of the second ion implantation process into the substrate to form the source and the drain.

15. The method of claim 11 wherein germanium (Ge) is used as the dopant of the pre-amorphization implant (PAI).

16. The method of claim 11 wherein the second spacer is formed using a plasma-enhanced chemical vapor deposition (PECVD) process at a temperature of 250~600° C. to deposit silicon nitride on the surface of the semiconductor wafer.

17. The method of claim 11 wherein the silicide layer is formed using a self-aligned silicide (salicide) process, the self-aligned silicide process comprising:
   forming a metal layer on the surface of the active area, the metal layer covering the surface of the source, the drain, and the gate;
   performing a first rapid thermal process (RTP);
   performing a wet etching process to remove unreacted metal of the metal layer; and
   performing a second rapid thermal process (RTP).

18. The method of claim 17 wherein the metal layer is composed of cobalt (Co), titanium (Ti), nickel (Ni), or molybdenum (Mo).

19. The method of claim 17 wherein the first rapid thermal process (RTP) is performed at a temperature of 400~600° C. for a period of 10~50 seconds, and the second rapid thermal process is performed at a temperature of 600~800° C. for a period of 10~50 seconds.

20. The method of claim 17 wherein the self-aligned silicide process drives the dopants of the first ion implantation process into the substrate to form a heavily doped drain (HDD) of the MOS transistor.

* * * * *